(12) United States Patent
Hooghan et al.

(10) Patent No.: US 7,202,782 B2
(45) Date of Patent: Apr. 10, 2007

(54) METHOD AND APPARATUS FOR DISABLING AN INTEGRATED CIRCUIT (IC) WHEN AN ATTEMPT IS MADE TO BYPASS SECURITY ON THE IC

(75) Inventors: Kultaransingh N. Hooghan, Allentown, PA (US); James T. Cargo, Bethlehem, PA (US); Charles W. Berthoud, Bethlehem, PA (US); Scott W. McLellan, Kempton, PA (US); Kouros Azimi, Center Valley, PA (US)

(73) Assignee: Agere Systems Inc., Allentown, PA (US)

( * ) Notice: Subject to any disclaimer, the term of this patent is extended or adjusted under 35 U.S.C. 154(b) by 139 days.

(21) Appl. No.: 10/911,176

(22) Filed: Aug. 4, 2004

(65) Prior Publication Data

US 2006/0028340 A1    Feb. 9, 2006

(51) Int. Cl.
*G08B 13/26* (2006.01)
(52) U.S. Cl. ............... 340/561; 340/568.1; 340/568.6; 340/571; 257/679; 257/922

(58) Field of Classification Search ................ 340/561, 340/568.1, 568.6, 571; 257/922, 679
See application file for complete search history.

(56) References Cited

U.S. PATENT DOCUMENTS

| | | | |
|---|---|---|---|
| 5,353,350 A | * | 10/1994 | Unsworth et al. .......... 713/194 |
| 2001/0033012 A1 | * | 10/2001 | Kommerling et al. ...... 257/679 |

* cited by examiner

*Primary Examiner*—Tai Nguyen

(57) ABSTRACT

The present invention provides an apparatus and method for detecting if a person has attempted to tamper with an integrated circuit (IC). The apparatus is located on the IC and comprises detection circuitry that detects a build up of electrical charge on the IC and disablement circuitry that disables the IC when the detection circuitry detects a build up of electrical charge on the IC. The method comprises detecting if a build up of electrical charge on the IC has occurred and disabling the IC when a build up of electrical charge on the IC has been detected.

13 Claims, 4 Drawing Sheets

METHOD AND APPARATUS FOR DISABLING AN INTEGRATED CIRCUIT (IC) WHEN AN ATTEMPT IS MADE TO BYPASS SECURITY ON THE IC

TECHNICAL FIELD OF THE INVENTION

The present invention relates to integrated circuits (ICs), and more particularly, to circuitry located on an IC that disables the IC when an attempt is made to bypass the security system on the same IC.

BACKGROUND OF THE INVENTION

As portable intelligent devices (PIDs) that include ICs such as, for example, smart cards and bankcards become more common, companies that make these devices and the financial industry as a whole are becoming increasingly concerned with fraudulent tampering with these devices. These devices typically include security systems that prevent the devices from being used by someone who does not have a security code that matches the security code of the device. However, criminals have discovered ways to bypass the security systems on the devices so that they can use them without knowing the security code.

One way in which criminals bypass security features on these devices is by using a Focused Ion Beam (FIB) system. FIB systems use a beam of Gallium ions to image and to make new electrical conductive connections and reroute existing connections, thereby enabling security features to be bypassed. Alternatively, existing connections can be cut to bypass security features. Once the security features have been bypassed, a criminal is able to use the device without a code to gain access to the cardholder's financial accounts.

A need exists for a circuit that can be incorporated into an IC of a portable intelligent device that would disable the device when an attempt is made to tamper with the circuitry on the device.

SUMMARY OF THE INVENTION

The present invention provides an apparatus and method for detecting if a person has attempted to tamper with an integrated circuit (IC). The apparatus is located on the IC and comprises detection circuitry that detects a build up of electrical charge on the IC and disablement circuitry that disables the IC when the detection circuitry detects a build up of electrical charge on the IC.

The method comprises detecting if a build up of electrical charge on the IC has occurred and disabling the IC when a build up of electrical charge on the IC has been detected.

These and other features and advantages of the invention will become apparent from the following description, drawings and claims.

DETAILED DESCRIPTION OF THE PREFERRED EMBODIMENT

In accordance with the preferred embodiment of the invention, circuitry is placed on the IC of the PID that disables the PID when an attempt is made to tamper with the IC. When FIB milling is used to reconfigure circuitry on a PID, the FIB milling machine operator normally grounds the IC of the PID so that excess charge that typically builds up during the milling process will not destroy the IC and thus prevent the criminal from being able to use it. Grounding the IC during the milling process causes at least some of the additional charge to be discharged to ground. Nevertheless, some of this additional charge will not be dissipated and will remain on the IC.

In accordance with the preferred embodiment, tamper detection circuitry is placed on the IC of the PID to detect when an attempt has been made to tamper with the IC of the PID and to cause the PID to be disabled when such an attempt has been made. The tamper detection circuitry includes circuitry that detects when additional charge is accumulated on the IC and circuitry that disables the IC when additional charge has built up on the IC. The tamper detection circuitry of the invention can be used with any IC that is used to carry financial account information, including, but not limited to, smart cards and bankcards. All such devices will be referred to herein as PIDs. The following describes particular embodiments for performing these functions. However, it will be understood by persons skilled in the art in view of the present disclosure that a variety of circuits other than those described herein can be designed that will perform the functions of the present invention.

Figure 1:
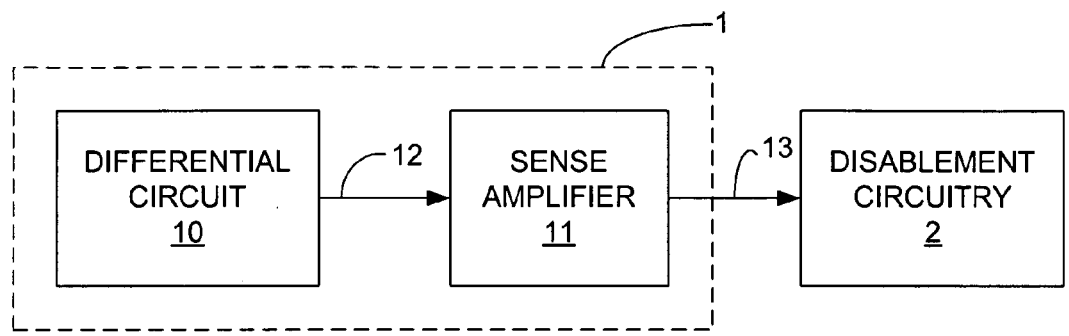
FIG. 1 illustrates a block diagram of the tamper detection circuitry of the present invention in accordance with the preferred embodiment.

FIG. 1 illustrates a block diagram of the tamper detection circuitry 1 of the present invention in accordance with the preferred embodiment. The tamper detection circuitry 1 includes a differential circuit 10 and a sense amplifier 11. The differential circuit 10 detects an imbalance in current flow caused by a change in the amount of charge that is on the IC and outputs a signal 12 to the sense amplifier 11. The sense amplifier 11 amplifies the received signal and outputs the amplified signal 13 to disablement circuitry 2. When the amplified signal received by the disablement circuitry 2 has reached a sufficient magnitude, the disablement circuitry 2 disables the PID.

Figure 2:
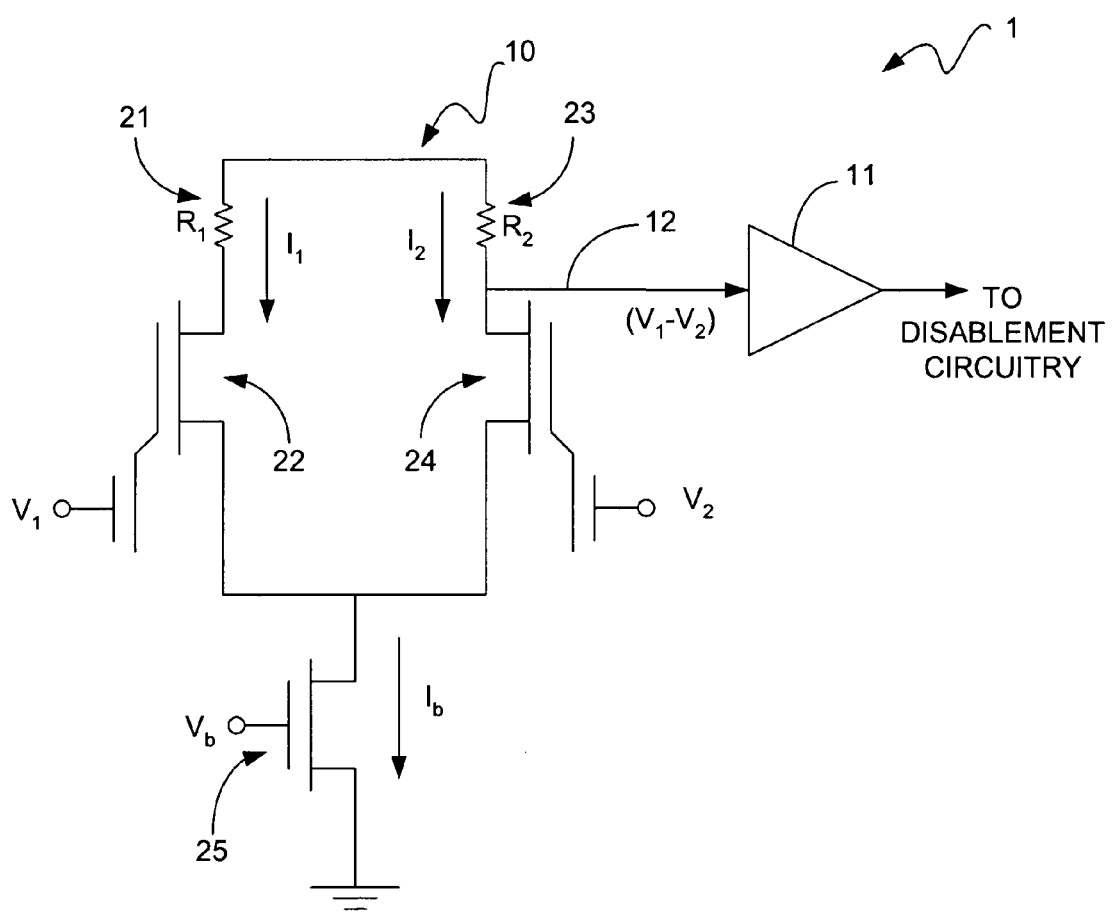
FIG. 2 is a schematic diagram of the tamper detection circuitry of the present invention in accordance with the preferred embodiment.

FIG. 2 is a schematic diagram of the tamper detection circuitry 1 of the present invention in accordance with the preferred embodiment. The differential circuit 10 preferably is a differential pair. One portion of the differential pair includes a resistor $R_1$ 21 and a floating gate metal oxide semiconductor (FGMOS) device 22. The other portion of the differential pair includes a resistor $R_2$ 23 and a FGMOS device 24. The differential circuit 10 includes an NMOS field effect transistor (NMOS) 25 that functions as a current source.

In accordance with this embodiment, initially $V_1$ and $V_2$ are set to the same voltage value. An FGMOS device has a capacitance that stores the voltage placed (i.e., coded) on the gate of the FGMOS device for a period of time. $R_1$ and $R_2$ are also set to the same values. Therefore, the currents 1, and 12 will remain equal as long as the gate voltages $V_1$ and $V_2$ remain equal. One of the gates is tied to a location on the IC that accumulates a buildup of charge when a person attempts to tamper with the IC. The other gate has a fixed voltage on it. When a person attempts to perform FIB, charge will build up on the IC, which will cause $V_1$ to vary (i.e., increase or decrease in value). This difference between $V_1$ and $V_2$ will be detected and amplified by sense amplifier 11. If the difference between $V_1$ and $V_2$ is large enough, the output signal 13 of the sense amplifier 11 will be large enough to cause the disablement circuitry 2 to disable the PID.

Using FGMOS devices allows the voltages on the gates of the devices to be set, or programmed, and the voltages will remain on the gates for very long periods of time. This obviates the need to recharge the PIDs or place power sources on them to provide power to the tamper detection circuitry 1, which is extremely advantageous when the PIDs are smart cards or bankcards, for example. Alternatively, one or more power supplies may be included on the IC of the PID for providing power to the tamper detection circuitry 1. Another alternative is to inductively couple power to the IC. For example, assuming the PID is a bankcard, when the card is inserted into an automated teller machine (ATM), the ATM card reader will inductively couple power to inductive coupling circuitry (not shown) on the PID, which would be provided to the tamper detection circuitry 1. If the PID has been tampered with, then when it receives power, the sense amplifier 11 will sense a relatively large difference between $V_1$ and $V_2$ and will output a signal to disablement circuitry 2 to cause the IC to be disabled.

Figure 3:
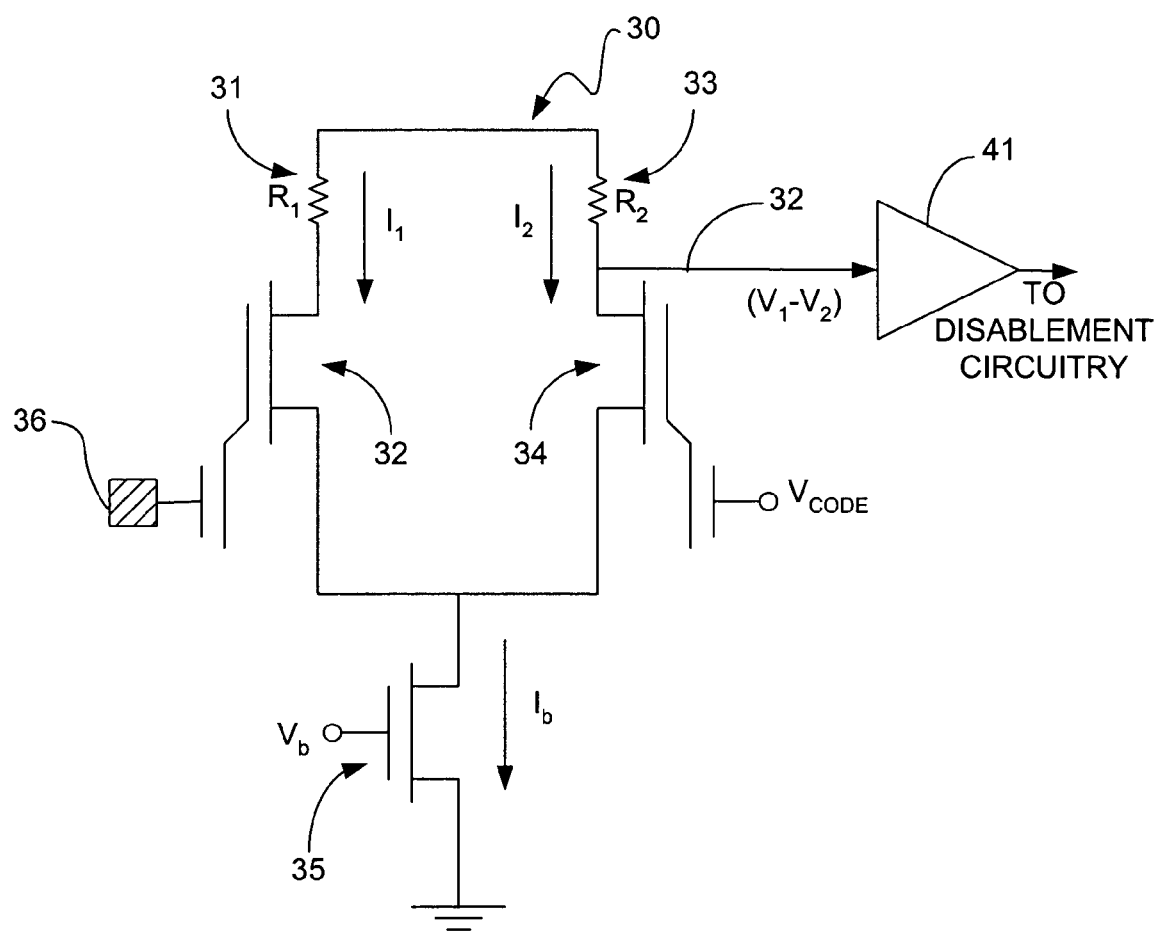
FIG. 3 is a schematic diagram of a differential pair circuit suitable for use in the differential circuit shown in FIG. 1, and which is coupled to a metal plate that accumulates electrical charge when an attempt is made to tamper with the IC.

FIG. 3 is a schematic diagram of a differential pair circuit 30 that is identical to the differential pair circuit 10 shown in FIG. 2 except that the gate of the FGMOS device 32 is connected to a metal plate 36. The elements 31–35 shown in FIG. 3 are identical to the elements 21–25 shown in FIG. 2, and therefore will not be described. When a person attempts to use FIB or some other process to modify the IC, charge will accumulate on the metal gate 36, which causes I1 and I2 not to be equal. This imbalance in current will produce a non-zero differential voltage $(V_1-V_2)$ at the input to the sense amplifier 41. The sense amplifier 41 will then produce an output voltage that is of sufficiently magnitude to cause the disablement circuitry of the IC to disable the IC. The gate of the FGMOS device 34 may be connected to an input pin of the IC or to a memory device. If connected to an input pin of the IC, a voltage level can be programmed onto the gate of FGMOS device 34 by an external voltage source, which may be, for example, a personal computer (PC) (not shown) connected to the input pin of the IC. In order to prevent someone from being able to measure the voltage stored on the gate of the FGMOS device 34, a fusible link (not shown) may be used to terminate the connection between the gate of FGMOS device 34 and the input pin of the IC after the voltage has been stored on the gate. Another way to encode voltage levels on the gates of the FGMOS devices would be to store voltage levels in a memory device (not shown) on the IC and cause the values stored in the memory device to be read out of the memory device and stored on the gates of the FGMOS devices.

Figure 4:
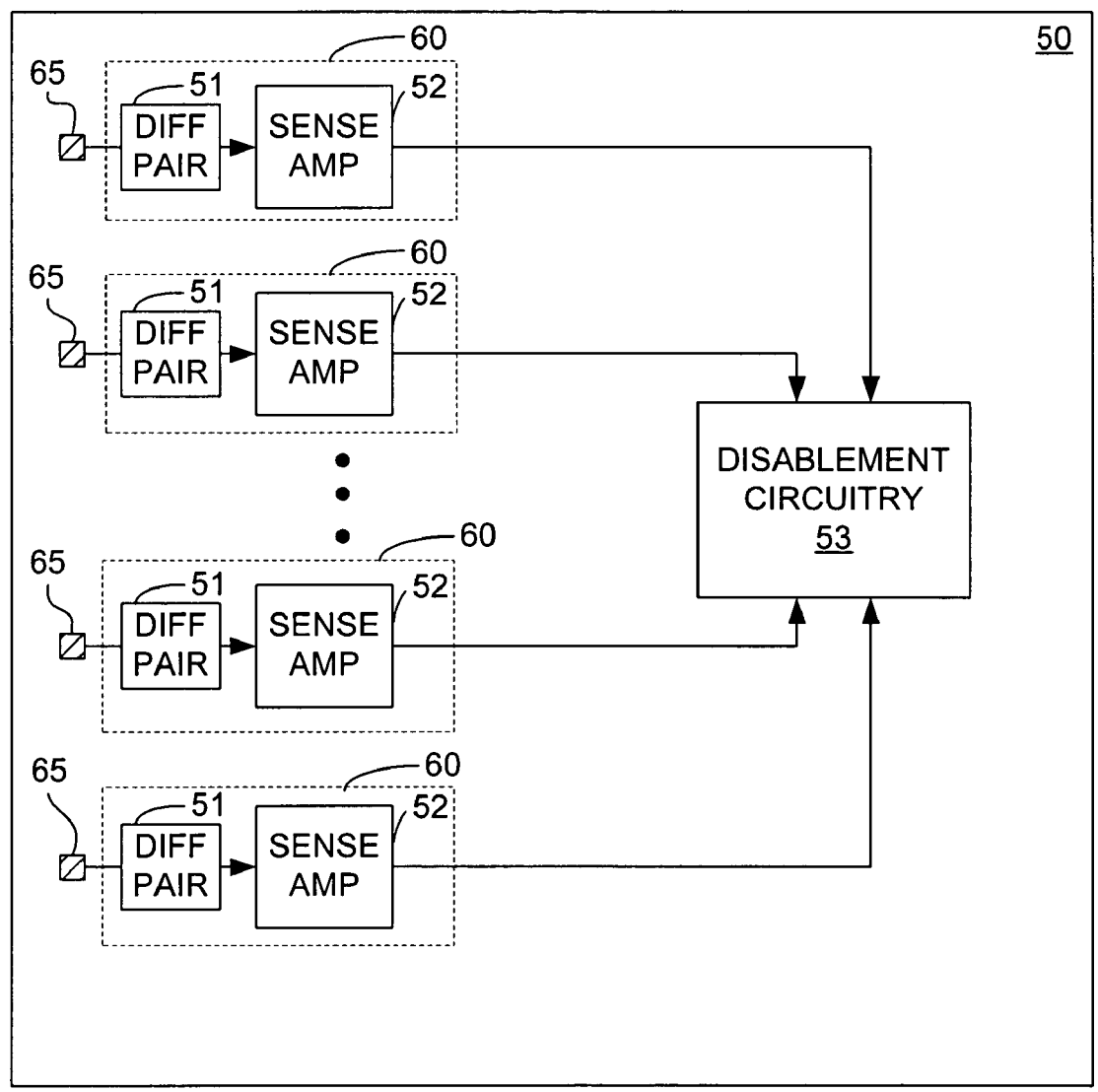
FIG. 4 is a block diagram of an IC of a PID that includes a plurality of the tamper detection circuits of the invention shown in FIG. 1.

FIG. 4 is a block diagram of an IC 50 of a PID that includes a plurality of tamper detection circuits 60 of the present invention. Each tamper detection circuit 60 includes a differential pair circuit 51 of the type shown in FIG. 2 and a sense amplifier 52. The outputs of the sense amplifiers 52 are all received by disablement circuitry 53 located on the IC 50. When the voltage level of the signal received from any one or more of the sense amplifiers 52 is sufficiently large, the disablement circuitry 53 disables the IC 50.

In each of the tamper detection circuits 60, one of the gates of the differential pair is tied to a metal plate 65. Placing the metal plates 65 at a variety of locations on the IC 50 increases the likelihood that tampering with the IC 50 will be detected. Although each differential pair circuit 51 is shown as being connected to a respective metal plate 65, it is possible for multiple differential pair circuits 51 to share a single metal plate 65. The other gate of the differential pair circuit 51 will be coded with a particular voltage level. It is possible to place different fixed voltages on different differential pair gates. For example, the gates of the FGMOS devices of one of the differential pairs may be set to 0.5 volts whereas the gates of the FGMOS devices of another of the differential pairs may be set to 0.25 volts. Coding the gates with different voltage values makes it even more difficult for a criminal to bypass security features on the PID. Even if a criminal were somehow able to determine the voltage on one of the FGMOS gates, an attempt to use that same gate voltage on all of the FGMOS gates will result in a current imbalance in the differential pair circuits that are programmed with a different gate voltage. The detected imbalance would result in the entire IC being disabled.

Figure 5:
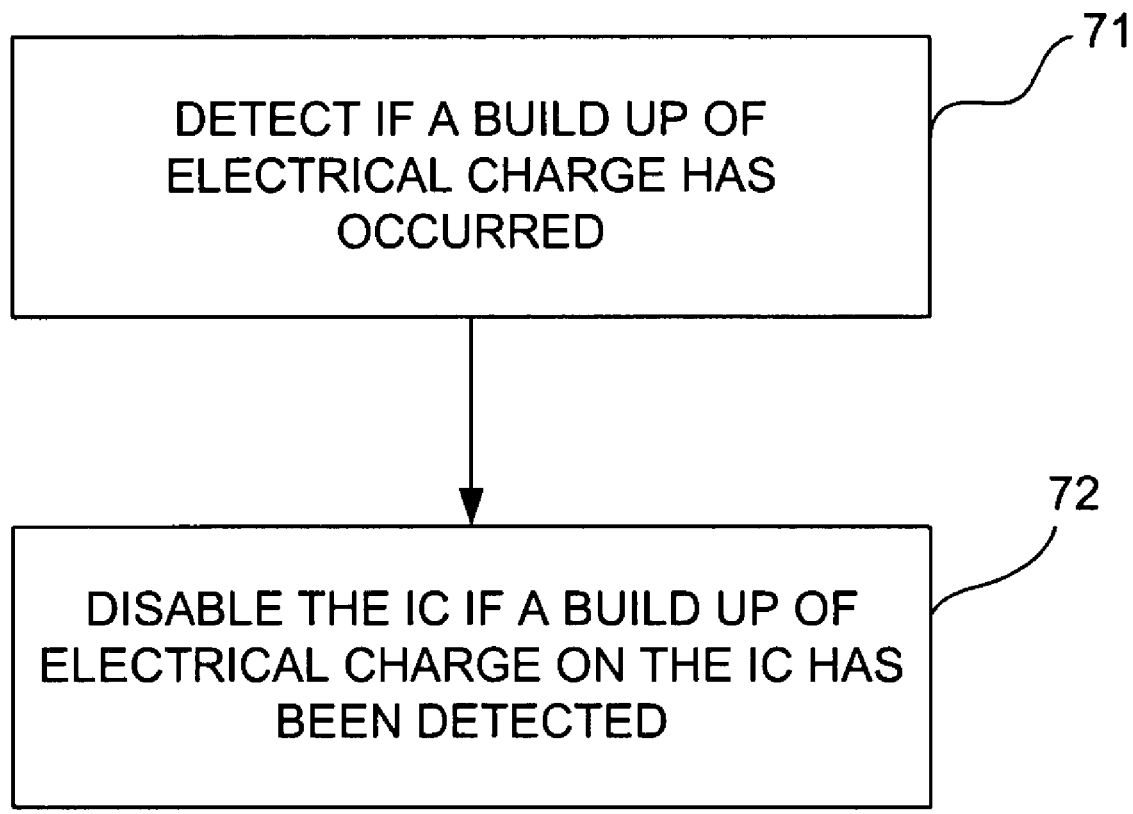
FIG. 5 illustrates a flow chart of the method of the present invention in accordance with the preferred embodiment.

FIG. 5 illustrates a flow chart of the method of the present invention in accordance with the preferred embodiment. As described above, detection circuitry detects if a build up of electrical charge on the IC has occurred, as indicated by block 71. Disablement circuitry then disables the IC when the detection circuitry detects a build up of electrical charge on the IC, as indicated by block 72.

It should be noted that the differential pair circuit shown in FIGS. 2 and 3 is only one of a variety of configurations that can be used in the tamper detection circuitry of the present invention. Those skilled in the art will understand, in view of the present disclosure, the manner in which other tamper detection circuit configurations may be designed to accomplish the goals of the present invention. Also, although FGMOS devices are shown as being used in the differential pair circuits, other types of transistors may be used for this purpose. The FGMOS devices are preferred because they are capable of storing a gate voltage for a very long period of time without having to replenish the voltage from a power supply. The invention also is not limited with respect to the type of PID with which it is used. The invention is suitable for use with any IC, especially where it is desirable to disable the IC when an attempt has been made to tamper with the IC. Those skilled in the art will understand that other modifications may be made to the embodiments described herein and that all such modifications are within the scope of the invention.

What is claimed is:

1. An apparatus for detecting if a person has attempted to tamper with an integrated circuit (IC), the apparatus being located on the IC, the apparatus comprising:
   detection circuitry that detects a build up of electrical charge on the IC due to tampering with the IC; and
   disablement circuitry that disables the IC when the detection circuitry detects a build up of electrical charge on the IC.

2. The apparatus of claim 1, wherein the detection circuitry includes:
   a differential circuit that detects an imbalance in current when electrical charge has built up on the IC and produces a differential voltage signal in response to the current imbalance; and an amplifier that amplifies the differential voltage signal to produce an amplified output voltage signal, the disablement circuitry receiving the amplified output voltage signal and disabling the IC in response to receiving the amplified output voltage signal.

3. The apparatus of claim 2, wherein the differential circuit includes a differential pair having first and second portions, the first portion including a first floating gate metal oxide semiconductor (FGMOS) device, the first FGMOS device having a gate.

4. The apparatus of claim 3, wherein the second portion of the differential pair includes a second floating gate metal oxide semiconductor (FGMOS) device, the second FGMOS device having a gate.

5. The apparatus of claim 4, wherein one of the first and second FGMOS device gates is connected to a metal plate on the IC and wherein the other of the first and second FOMOS devices is set at a substantially fixed voltage level, the metal plate accumulating electrical charge if an attempt is made to alter the IC such that a voltage level on the gate connected to the metal plate changes from an initial gate voltage level to a new gate voltage level, wherein when the voltage level on the gate connected to the metal plate changes to the new voltage level, said differential voltage signal is produced.

6. The apparatus of claim 5, wherein the apparatus includes a plurality of differential pairs and a plurality of metal plates, the metal plates being located at various locations on the IC, each differential pair having a gate of one of the FGMOS devices connected to one of the metal plates.

7. The apparatus of claim 5, wherein whichever FGMOS device gate is not connected to the metal plate is connected to an input pad of the IC, the substantially fixed voltage level being placed on the gate via the input pad of the IC.

8. The apparatus of claim 5, wherein whichever FGMOS device gate is not connected to the metal plate is connected to a memory device of the IC, the substantially fixed voltage level being placed on the gate by being output from a location in the memory device to the gate via an electrical connection between the memory device location and the gate to which the memory device is connected.

9. A method for detecting if a person has attempted to tamper with an integrated circuit (IC), the method comprising:

detecting if a build up of electrical charge on the IC has occurred due to tampering with the IC; and disabling the IC when a build up of electrical charge on the IC has been detected.

10. The method of claim 9, wherein the detecting the build up of electrical charge on the IC includes:

detecting an imbalance of current in a differential circuit on the IC, the imbalance of current occurring when electrical charge has built up on the IC, the differential circuit producing a differential voltage signal in response to the current imbalance; and amplifying the differential voltage signal to produce an amplified output voltage signal that is used by disablement circuitry on the IC in the disabling step to disable the IC.

11. The method of claim 10, wherein the differential circuit includes a differential pair having first and second portions, the first portion including a first floating gate metal oxide semiconductor (FGMOS) device, the first FGMOS device having a gate.

12. The method of claim 11, wherein the second portion of the differential pair includes a second floating gate metal oxide semiconductor (FGMOS) device, the second FGMOS device having a gate.

13. The method of claim 12, wherein one of the first and second FGMOS device gates is connected to a metal plate on the IC and wherein the other of the first and second FGMOS devices is set at a substantially fixed voltage level, the metal plate accumulating electrical charge if an attempt is made to alter the IC such that a voltage level on the gate connected to the metal plate changes from an initial gate voltage level to a new gate voltage level, wherein when the voltage level on the gate connected to the metal plate changes to the new voltage level, said differential voltage signal is produced.

* * * * *